(12) United States Patent
Kirichenko et al.

(10) Patent No.: US 7,443,719 B2
(45) Date of Patent: Oct. 28, 2008

(54) SUPERCONDUCTING CIRCUIT FOR HIGH-SPEED LOOKUP TABLE

(75) Inventors: Alex F. Kirichenko, Pleasantville, NY (US); Timur V. Filippov, Mahopac, NY (US); Deepnarayan Gupta, Hawthorne, NY (US)

(73) Assignee: Hypres, Inc., Elmsford, NY (US)

( * ) Notice: Subject to any disclaimer, the term of this patent is extended or adjusted under 35 U.S.C. 154(b) by 233 days.

(21) Appl. No.: 11/360,749

(22) Filed: Feb. 23, 2006

(65) Prior Publication Data

US 2007/0194958 A1 Aug. 23, 2007

(51) Int. Cl.
*G11C 11/44* (2006.01)
(52) U.S. Cl. ............... 365/160; 365/94; 365/230.06
(58) Field of Classification Search ........... 365/162, 365/230.06, 230.08, 160, 161, 230.01, 94
See application file for complete search history.

(56) References Cited

U.S. PATENT DOCUMENTS

| | | | | |
|---|---|---|---|---|
| 4,506,172 | A * | 3/1985 | Hasuo | 326/6 |
| 6,154,044 | A * | 11/2000 | Herr | 326/1 |
| 6,836,141 | B2 | 12/2004 | Herr | 326/3 |

OTHER PUBLICATIONS

Kirichenko et al. "4-bit Rapid Single-Flux-Quantum Decoder," Jun. 1995, IEEE Transactions on Applied Superconductivity, vol. 5, No. 2, pp. 2857-2860.*

Polonsky et al. "New RSFQ Circuits," Mar. 1993, IEEE Transactions on Applied Superconductivity, vol. 3, No. 1, pp. 2566-2577.*

Filippov et al. "Look-Up Table for Superconductor Digital-RF Predistorter," Jun. 2007, IEEE Transactions on Applied Superconductivity, vol. 17, No. 2, pp. 561-564.*

Bunyk et al., RFSQ Microprocessor: New Design Approaches, IEEE Transactions on Applied Superconductivity, vol. 7, No. 2, Jun. 1997, pp. 2697-2704.

K.K. likharev and V.K. Semenov, RSFQ Logic/Memory Family: A new josephus In-Junction Technology For Sub-Terahertz-Clock-Frequency Digital Systems, IEEE, vol. 1, No. 1, Mar. 1991, pp. 9-18.

\* cited by examiner

*Primary Examiner*—VanThu Nguyen
*Assistant Examiner*—Alexander Sofocleous
(74) *Attorney, Agent, or Firm*—Milde & Hoffberg LLP

(57) ABSTRACT

A high-speed lookup table is designed using Rapid Single Flux Quantum (RSFQ) logic elements and fabricated using superconducting integrated circuits. The lookup table is composed of an address decoder and a programmable read-only memory array (PROM). The memory array has rapid parallel pipelined readout and slower serial reprogramming of memory contents. The memory cells are constructed using standard non-destructive reset-set flip-flops (RSN cells) and data flip-flops (DFF cells). An n-bit address decoder is implemented in the same technology and closely integrated with the memory array to achieve high-speed operation as a lookup table. The circuit architecture is scalable to large two-dimensional data arrays.

23 Claims, 13 Drawing Sheets

SUPERCONDUCTING CIRCUIT FOR HIGH-SPEED LOOKUP TABLE

GOVERNMENT CONTRACT

The invention described herein may be manufactured, used, imported, sold, and licensed by or for the Government of the United States of America without the payment to me of any royalty thereon.

This invention was made with Government support under Contract Number N00039-04-C-2134 awarded by the Department of the Navy. The Government has certain rights in the invention.

FIELD OF THE INVENTION

This invention relates to superconducting integrated circuits, specifically the development of a fast superconducting lookup-table memory array, which may be applied to ultrafast digital signal processing.

BACKGROUND OF THE INVENTION

Ultrafast superconducting digital circuits are based on Josephson junctions integrated together according to RSFQ Logic (Rapid-single-flux-quantum), as originally developed and described by K. K. Likharev and V. K. Semenov (1991). Fast memory circuits in the same technology are also required for most non-trivial digital applications. One class of memory arrays are random-access memories, or RAM, which are particularly important for digital computing applications. Such applications require equally fast data writing and data retrieval. This is in contrast to many digital signal processing applications, in which the memory contents need to be read out quickly, but updated only rarely, requiring a programmable read-only memory (PROM) instead of a RAM. A particular application of interest is a circuit for real-time digital predistortion of radio-frequency (RF) signals, where the predistortion parameters would be maintained in a digital lookup table.

There have been several circuits proposed for superconductor RAM, such as the Ballistic RAM circuit invented by Herr (U.S. Pat. No. 6,836,141). However, such a circuit does not help one design a fast PROM, which has an architecture that is completely different. There have been no prior publications or patents describing a PROM-type RSFQ memory array or lookup table.

The article by Bunyk et al., entitled *RFSQ Microprocessor: New Design Approaches* in IEEE Transactions on Applied Superconductivity, Vol 7, No. 2, June 1997, pp 2697-2704 utilizes an RFSQ Data Processing pipeline architecture, similar but distinct from that used in the code matching network of the present invention.

SUMMARY OF THE INVENTION

A digital lookup table takes a digital input X and provides a digital output Y such that Y=F(X), for any function F that is programmed into the memory array. The output values for each input value are stored in memory, and are recalled as needed. The circuit of the present invention comprises an address decoder and a programmable read-only memory array (PROM). The memory array has rapid parallel pipelined readout and slower serial reprogramming of memory contents. The memory cells are constructed using standard RSFQ elements, the non-destructive reset-set flip-flops (RSN cells) and data flip-flops (DFF cells). An n-bit address decoder is implemented in the same technology and closely integrated with the memory array to achieve high-speed operation as a lookup table. A prototype section of a lookup table based on the invention, with a 3×4 address decoder and a 4×3 memory matrix, has been designed and fabricated on a 5 mm×5 mm niobium superconducting integrated circuit, for target operation at a clock frequency of 20 GHz which can result in a target rate of 20 G words/sec. The circuit architecture is scalable to large two-dimensional data arrays.

DETAILED DESCRIPTION OF THE INVENTION

Figure 1:
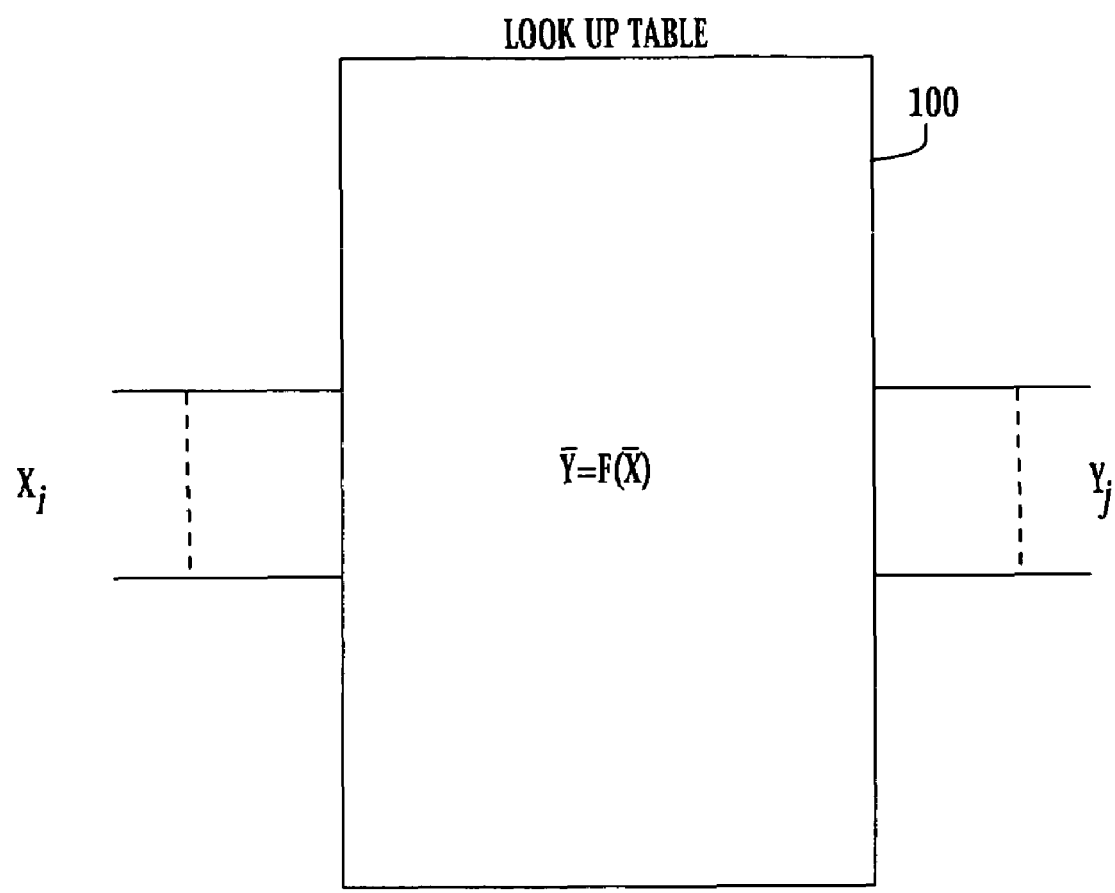
FIG. 1 shows a lookup table in accordance with one aspect of the invention.

FIG. 1 shows a lookup table in accordance with one aspect of the invention. The lookup table, 100, accommodates a set of input lines, the states of which are labeled $X_i$. Similarly, the output of the lookup table comprises a plurality of output lines, the output states of which are labeled $Y_j$. For each input state, represented by the vector $\overline{X}$ an output state is produced which is represented by the vector $\overline{Y}$. The contents of the lookup table are programmed so as to produce a relationship $\overline{Y}=f(\overline{X})$. As a result, the lookup table produces a functional transformation of the input states into a corresponding set of output states.

Figure 2:
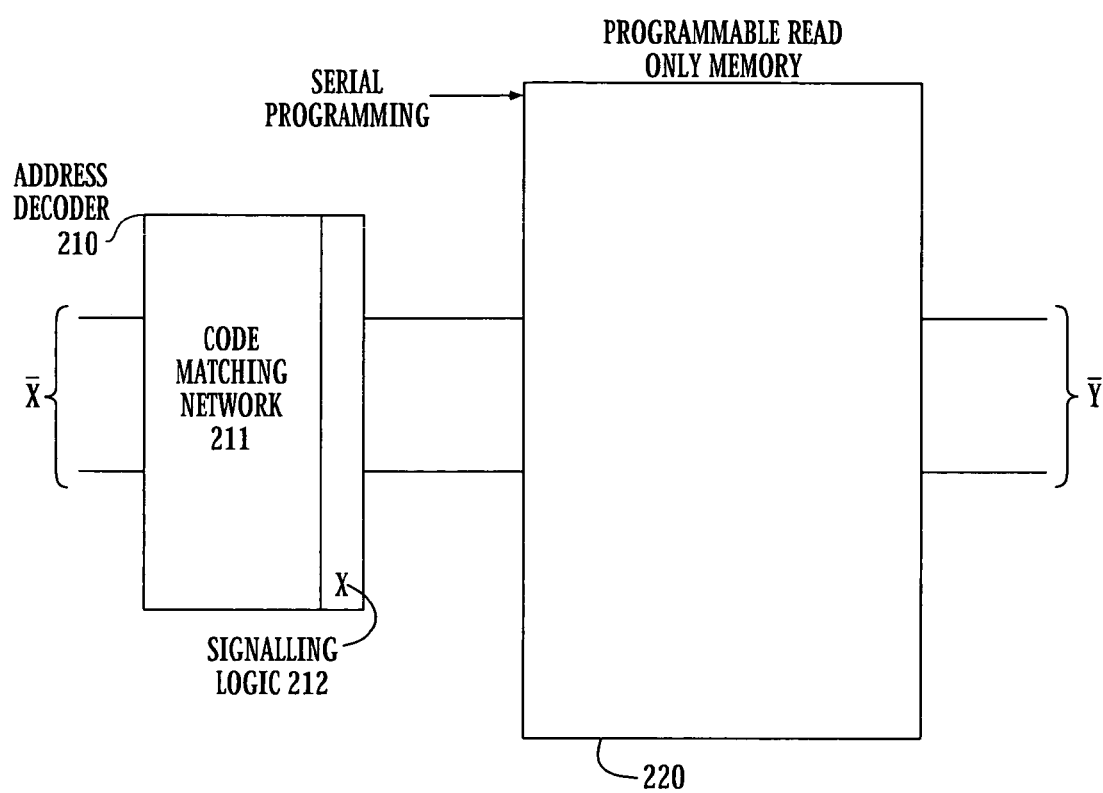
FIG. 2 is a block diagram showing the components of the lookup table of FIG. 1.

FIG. 2 is a block diagram showing the components of the lookup table of FIG. 1. The lookup table in accordance with the invention comprises an address decoder 210, comprising a code matching network 211 and signaling logic 212, coupled to a programmable read only memory array 220. The states of the input vector $\overline{X}$ are applied to the address decoder 210 and the address decoder 210 selects, using the programmable read only memory, the output states to be retrieved from the memory and applied to the output lines, resulting in the output state $\overline{Y}$. The programming of the programmable read only memory is applied through the line labeled "serial programming".

Figure 3:
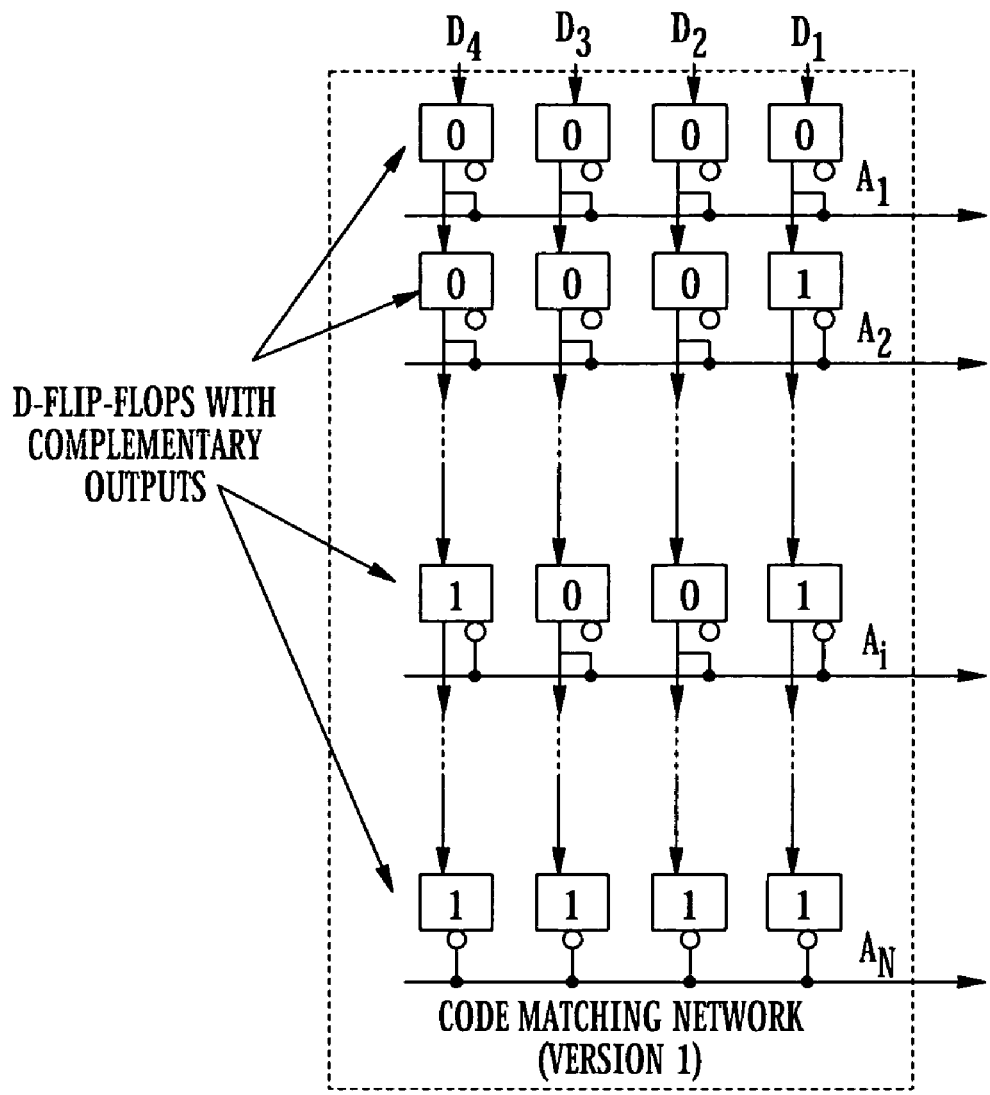
FIG. 3 is a block diagram of a first code matching network implemented using a D flip-flop with complementary outputs in accordance with one aspect of the invention.

FIG. 3 is a block diagram of a first code matching network implemented using D flip-flops with complementary outputs. Each row of D flip-flops corresponds to a particular digital word and is activated by that digital word. For example, the third row shown in FIG. 3 is programmed to respond (or not respond) to the digital word 1001. The complementary output is connected to the line $A_i$ for the first and last cells of the row whereas the regular output is connected to line $A_i$ for the middle two cells of the row. One can see that the input lines $D_i$ at the top of the address decoder in FIG. 6 provide a digital word to be loaded to the first row $A_1$, where that row $A_1$ will either respond or not respond to the states of the digital word to produce an output $A_1$. In the instance shown in FIG. 3, when the digital word 1001 is applied to the inputs $D_1 \ldots D_4$, and propagated down to the row $A_i$, the logic one state in column $D_1$ will result in a null output, the logic zero state in column $D_2$ will result in a zero output, the logic zero state in the third column will result in a zero output and finally, the logic one state applied in column $D_4$ will be changed to a zero so that the state of all outputs on line $A_i$ is zero. Every other line $A_k$, where $k$ is not equal to $i$, will have at least one cell producing a logical one on the output of that line, resulting in all ones output with the exception of line $A_i$, which will have a zero output.

The contents of the flip-flops of row A1 are passed in pipe line fashion to the corresponding flip-flops in row $A_2$ and then to row $A_3$ and then down the remainder of the rows to the last row $A_N$. Thus, a digital word input on the input lines $D_i$ propagates in pipeline fashion through the address decoder. One should note that, in the example shown, the selection of regular and complementary outputs for each flip-flop in a row is set to produce no output on the output line $A_i$ when the digital word for which it is programmed is applied to that row of D flip-flops.

Figure 4A:
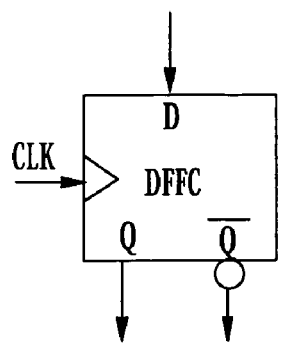
FIG. 4A shows a block symbol for a D flip-flop with complementary output.

FIG. 4A shows a block symbol for a D flip-flop with complementary output.

Figure 4B:
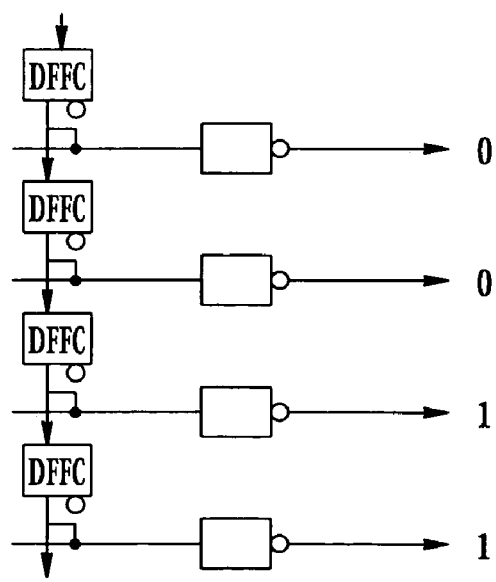
FIG. 4B shows a column of the first code matching network implemented using a D flip-flop with complementary output.

FIG. 4B shows another example of a column of an address decoder implemented using a D flip-flop with complementary output. This example corresponds to column $D_4$ of FIG. 3. When the output of a particular row of the code matching network is designed to produce logic 0 when the digital word for which a row is hardwired is applied to that row, signaling logic can be used to change the logic 0 state to a logic 1 output. In FIG. 4B, the signaling logic is comprised of a column of inverters.

The address decoder, works on the premise of code matching. When the input address finds its match in a row of the code-matching part, the signaling logic for that row sends a "Read" pulse to the memory shown in FIGS. 3 and 4B. This scheme uses identical cells for the entire code-matching part of the decoder and is logically simple. In each column, the true (Q) output of each DFFC is connected to the data input (D) of the next DFFC below it. The output value is determined by choosing and hard-wiring either the true output or the complementary output to the output line.

Figure 5:
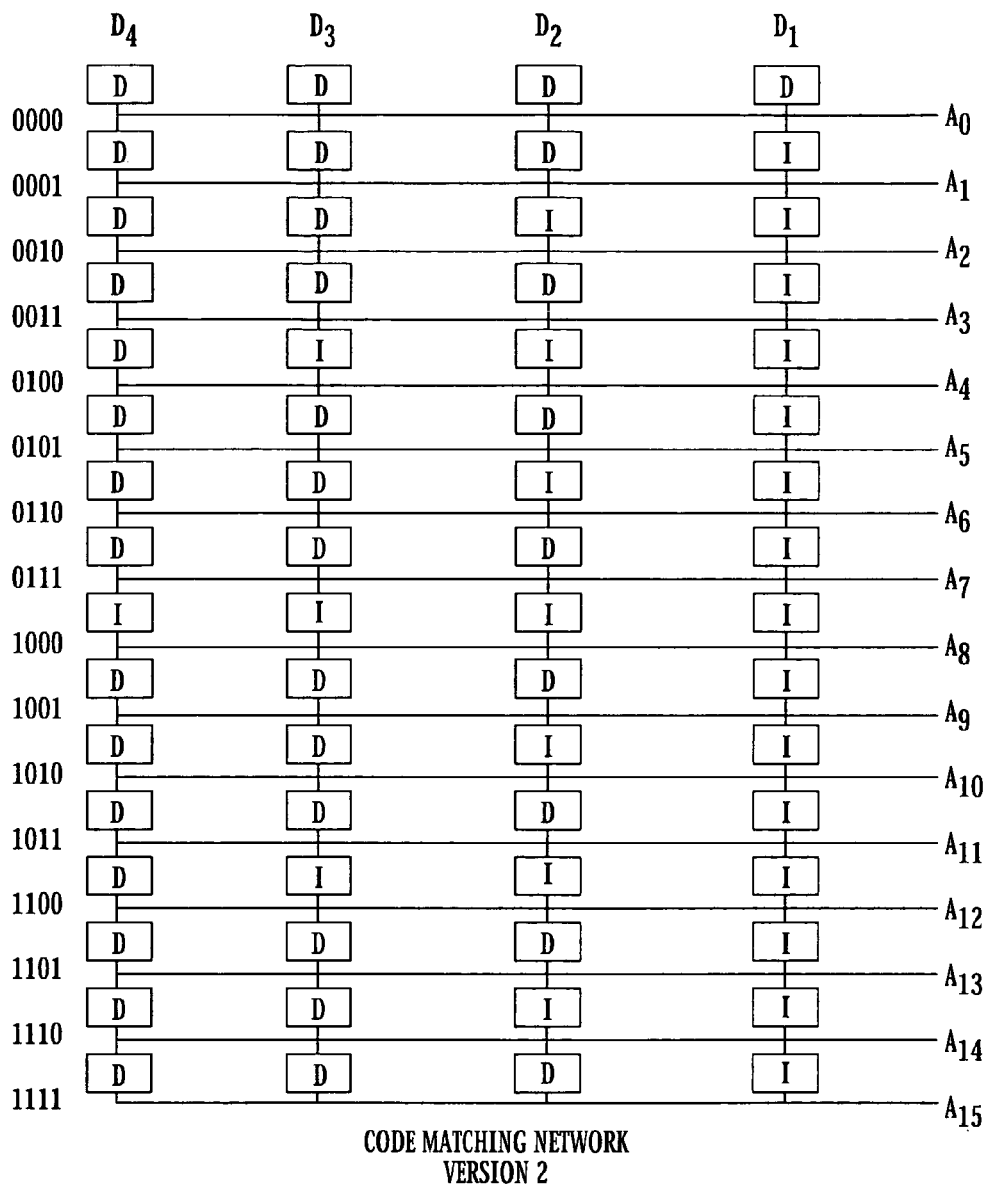
FIG. 5 is a block diagram of a second code matching network in accordance with one aspect of the invention.

FIG. 5 is a block diagram of a second code matching network in accordance with one aspect of the invention. Unlike the first code matching network shown in FIG. 3, which is comprised exclusively of D flip-flops with complementary outputs, this alternate arrangement takes note of the fact that in the version of FIG. 3, only a direct or inverted output is utilized. This permits an alternative code matching network to be constructed utilizing only D flip-flops (without complementary outputs) and inverters. In the version shown in FIG. 5, each row is programmed to produce an output when the code word that reaches that row matches the word shown at the extreme left of each output line $A_i$ of FIG. 5. Each bit of the incoming digital word, $D_i$, propagates down a respective column $D_1$-$D_4$. As it propagates down the column, it is either propagated unchanged by a D flip-flop or is inverted by an inverter. Although a number of arrangements are possible for the digital words, the programming shown in FIG. 5 is designed to map to a digital counting sequence from 0-15. Based on the binary value of the incoming digital word (e.g. 0101) the output for that digital word will appear, in the case of the example, on line $A_5$. Thus, the code matching network can be implemented using only D flip-flips and inverters without the need for complementary outputs on the D flip-flops.

Figure 6A:
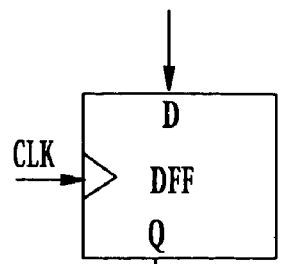
FIGS. 6A and 6B show a block symbol for a D flip-flop (without complementary output) and a block symbol for an inverter, respectively.
Figure 6B:
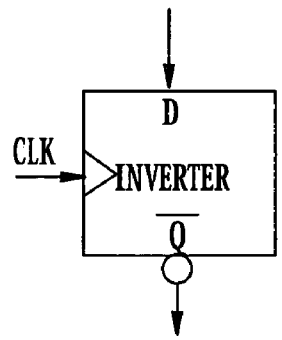

FIGS. 6A and 6B show a block symbol for a D flip-flop (without complementary output) and a block symbol for an inverter, respectively.

Figure 6C:
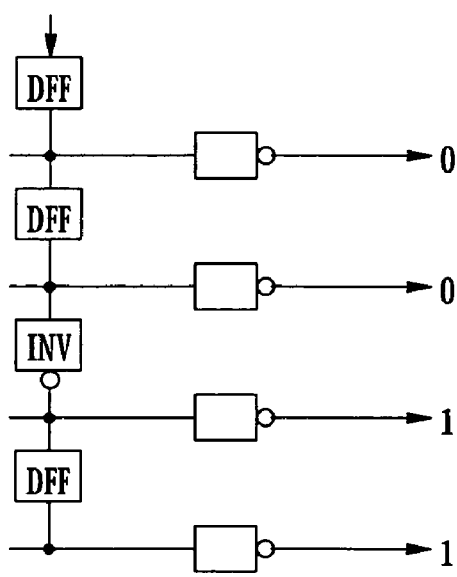
FIG. 6C shows an alternative column of an address decoder implemented using D flip-flops and inverters.

FIG. 6C shows a column of an address decoder implemented using D flip-flops and inverters. In certain embodiments, it is desirable to avoid using D flip-flops with complementary outputs in favor of selectively arranging D flip-flops (without complementary outputs) together with inverters to produce the desired logical patterns as shown in the example shown in FIG. 6C.

Each cell in the code-matching matrix performs two functions: (1) it produces an output to the signaling logic part, and (2) it allows synchronous data-flow down the column to the cell in the next row. Recognizing that as far as the output signaling is concerned, each DFFC, in this hard-wired configuration, works either as a DFF or as a NOT (clocked inverter) but never both, one can simplify the circuit complexity by choosing only one of them for each cell. Logically, this scheme is more complex because one has to account for inversions in the data flow-down path. One can do this by configuring the code-matching matrix column-by-column by placing a NOT cell to change the value (0-to-1 and 1-to-0) and a DFF cell when no change is needed. One column of such an arrangement (also corresponding to column $D_4$ of FIG. 3) is shown in FIG. 6C.

It is possible to design the code matching network to produce a logic 1 when a match occurs. Different signaling logic is utilized when the code matching network is designed to produce a 0 output on a line when a code match occurs from the situation when a logic 1 is produced on an output line by the code match network.

Figure 7A:
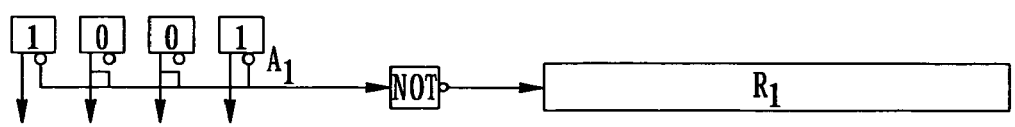
FIG. 7A shows signaling logic used when a code word match results in a logic 0 output.

FIG. 7A shows signaling logic used when a code word match results in a logic 0 output.

Figure 7B:
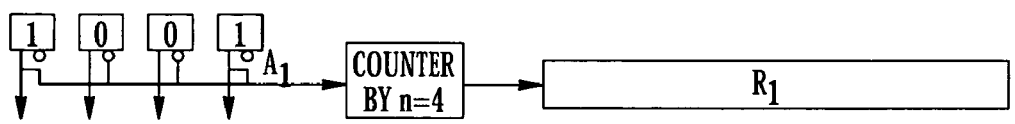
FIG. 7B shows signaling logic used when a code word match results in a logic 1 output.

FIG. 7B shows signaling logic used when a code word match results in a logic 1 output. With logic 1 outputs, provision should be made to ensure that the output pulses for a row are not coincident, so they can be individually counted. This can be accomplished, for example, by introducing differential delays in the pulses traversing different columns of the code matching network.

Figure 8A:
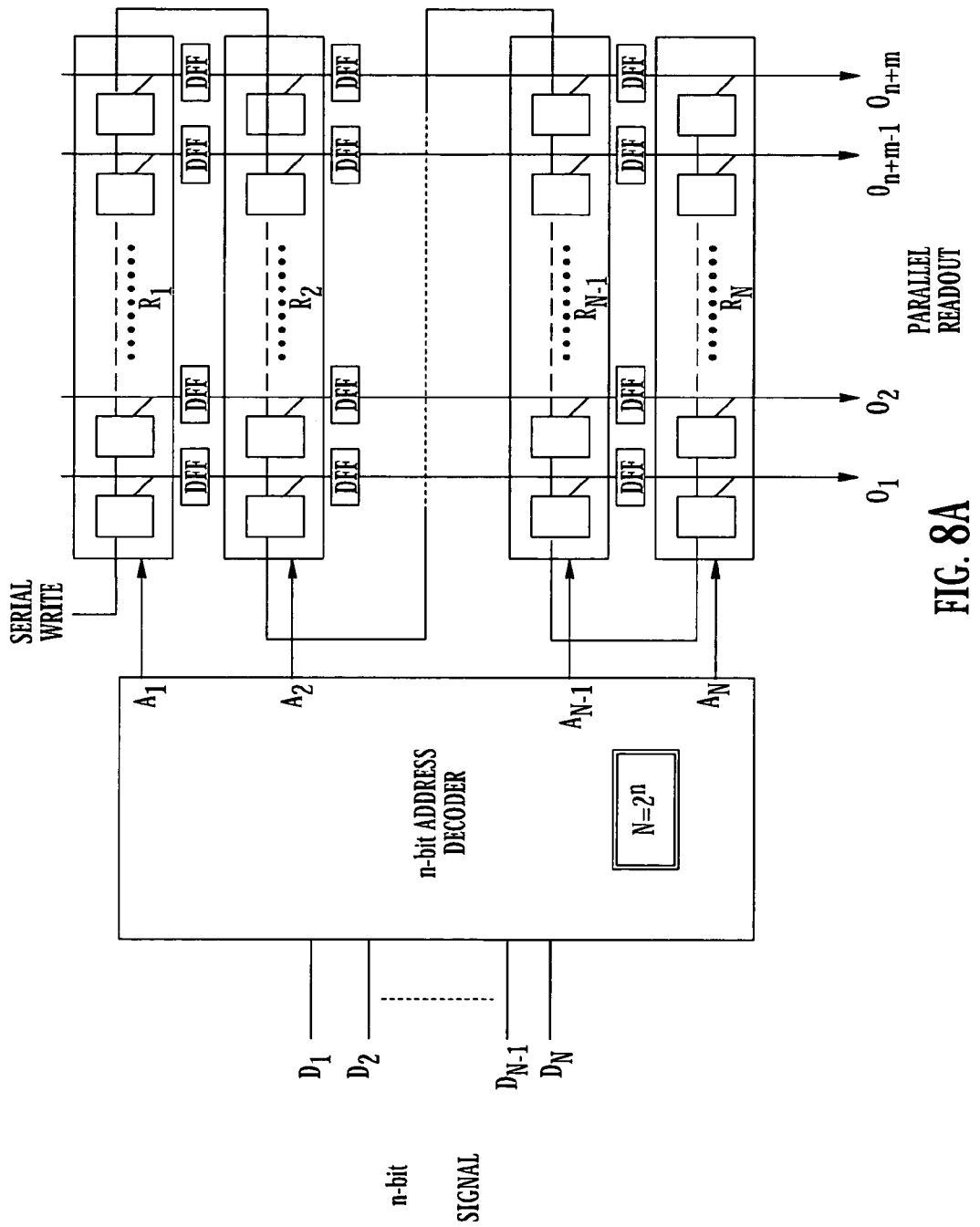
FIG. 8A is a block diagram showing the memory portion of FIG. 2 in more detail.

FIG. 8A is a block diagram showing the memory portion of FIG. 2 in more detail. In the example shown in this figure, the input applied to lines D1-$D_n$ is an n-bit signal. Such a signal might be generated, for example, when an incoming RF signal is oversampled and a digital value of each sample is applied sequentially to the n-bit address decoder. The states of the n-bit signal comprise the input $\overline{X}$, discussed previously. The n-bit address decoder has a number of output lines, one corresponding to each state of the input vector $\overline{X}$. Thus, for binary signals, the number of output lines of the n-bit address decoder is $N=2^n$. Each output line labeled $A_k$ feeds a row of the memory array shown in FIG. 8A. There is an output line $A_k$ for each state of the input lines $D_i$, that is, each different state of the input lines activates a selected output line $A_k$ which then activates a row of the memory array.

To the upper left of the memory array shown in FIG. 8A, is a "Serial Write" input. That Serial Write input line is utilized to load the contents of the non-destructive read out cells of the memory. One can see by following the Serial Write line through the memory array that the cells are loaded in a serial fashion by sequentially clocking the input data through the array row by row, with some rows being loaded left to right and others being loaded right to left. Although the memory array is pre-loaded serially with the desired output of the lookup table, the read out is accomplished in parallel fashion as discussed more hereinafter. A write cycle at 1 Gbit/s would be completed in about half a microsecond for a memory with 64 8-bit words.

Figure 8B:
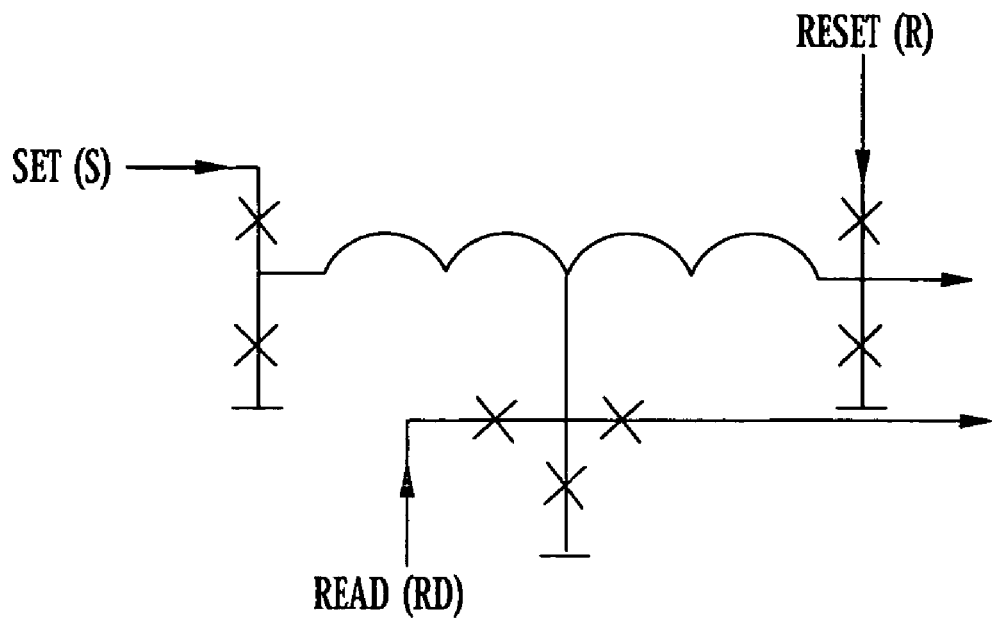
FIGS. 8B and 8C show a schematic and a block symbol, respectively, of an RS flip-flop circuit with non-destructive read out (NDRO).
Figure 8C:
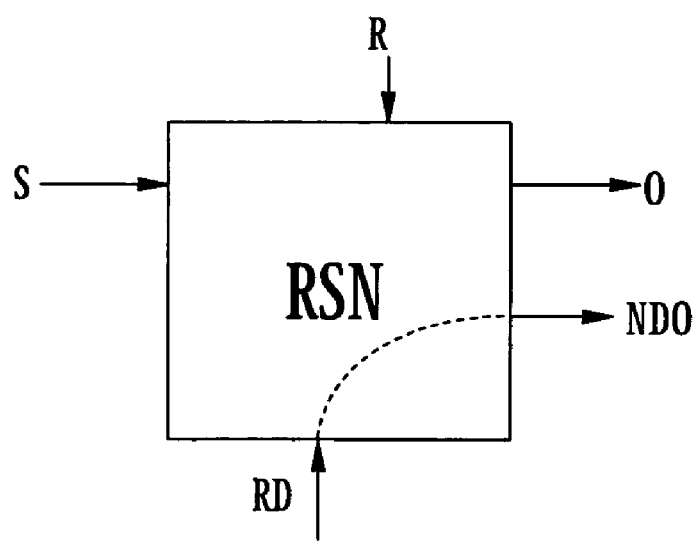

FIGS. 8B and 8C show a schematic and a block symbol of an RS flip-flop with non-destructive read out (NDRO), respectively. The block symbol utilized in the depiction of the memory cells is shown in FIG. 8C. The schematic for the RSN circuit is shown in FIG. 8A. It is comprised of Josephson junctions, indicated by the symbol X. the operation of NDRO cells is described in the article by Likharev and Semenov referenced previously.

Figure 8D:
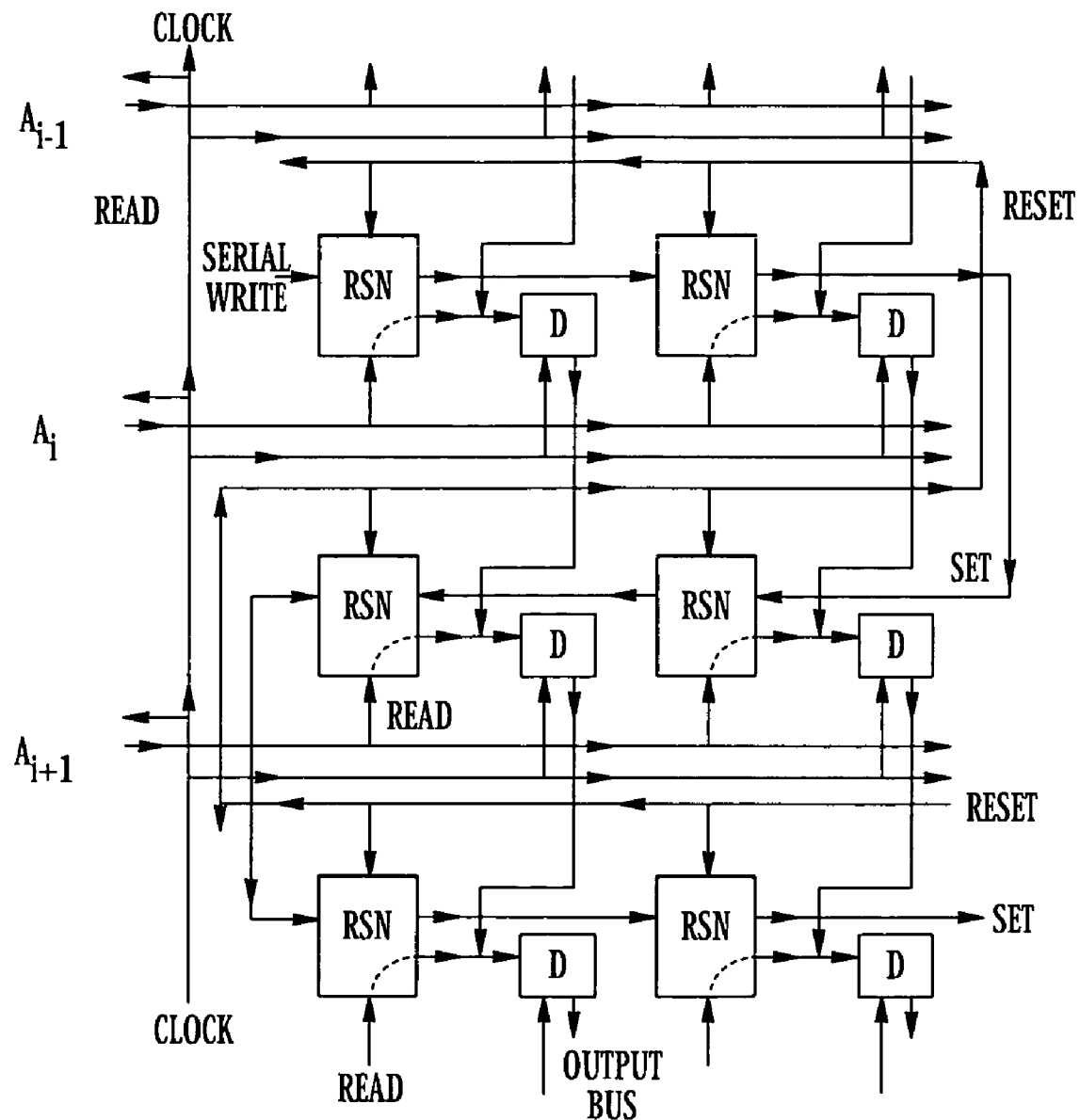
FIG. 8D shows an exemplary architecture of memory cells shown in FIG. 8A.

FIG. 8D shows an exemplary architecture of memory cells of FIG. 8A. Each memory cell is comprised of an RS flip-flip with non-destructive read out (NDRO), labeled hereinafter RSN, plus a type D flip-flop labeled D. Each row of the memory cells is accessed by activating its respective line $A_i$ which causes the NDRO cell RSN to transfer its contents to the type D flip-flop D. The entire row is read out at one time and so the contents of the entire row of RSN's is transferred to the corresponding type D flip-flops for that row.

The type D flip-flops of a given row then transfer (vertically as shown) their contents to the next type D flip-flop in the column which then transfers its contents to the next type D flip-flop in the column and so on down to the output of the final type D flip-flop for a column which is applied to an output bus.

As discussed in conjunction with FIG. 8A, the contents of the memory cells are loaded sequentially. This is illustrated in FIG. 8D by the serial write input providing in a serial fashion the contents for each of the RSN portions of the memory cells. As shown, each of the RSN memory cells is linked in a serial fashion for writing of the contents of those memory cells via the Serial Write input.

Figure 9:
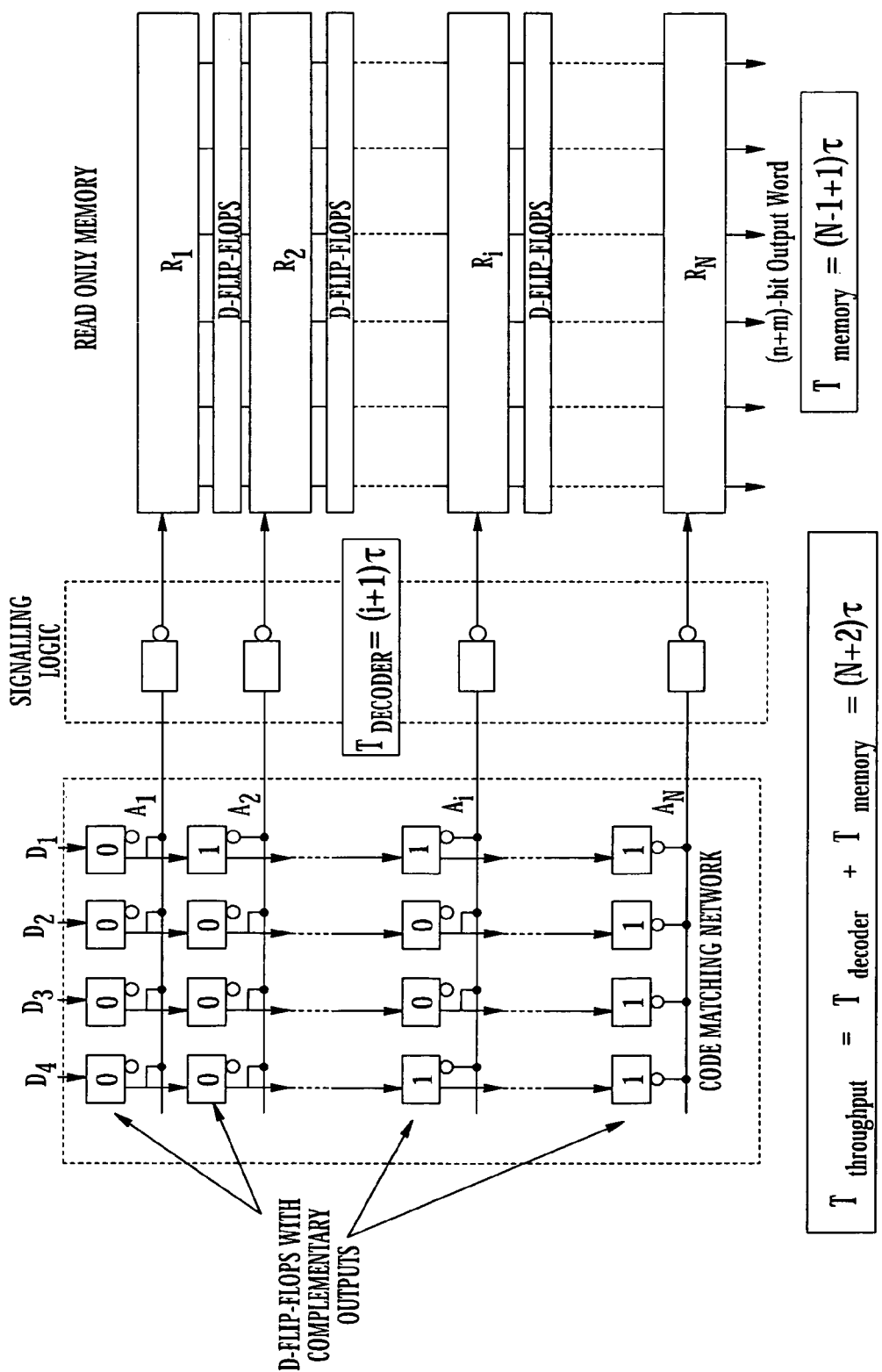
FIG. 9 illustrates pipeline operation of the lookup table in accordance with one aspect of the invention.

FIG. 9 illustrates the pipeline operation of the lookup table in accordance with one aspect of the invention. As mentioned above, the n-bit input signal is applied to the input lines $D_i$ of the code matching network. Each digital word received at input lines $D_i$ is propagated in pipeline fashion down the columns of the code matching network where the decoding operation, previously described occurs. The output state of a particular line $A_i$, depends on whether or not the digital word currently resident in the row of the address decoder corresponds to the digital word for which that row has been programmed to respond. If the digital word does correspond, the output online $A_i$ is zero, in the embodiment shown, which is inverted by signaling logic (inverter) to the right of line $A_i$ to logical 1. As a result, each digital word in the address decoder will either produce (1) a logical zero on output line $A_i$ to which it corresponds or (2) a logical 1. The logical zero output on line $A_i$ will occur when the digital word in that row of D flip-flops with complementary outputs matches the outputs set for which that row is programmed. If it does match, the inverter will change the output state from logic zero to logic 1 thereby activating a transfer of the contents of the NDRO cells of row $A_i$ of the Programmable Read Only Memory to the output flip-flops for propagation down to the output bus.

The code matching elements shown in FIG. 9 are inverters as shown in FIG. 7A. This is convenient when the output line $A_i$ has a zero when the code word matches the logical states for which that line is programmed. However, in some situations, it is desirable that instead of producing an output zero on a particular line $A_i$ of the address decoder, it is desirable, instead, to produce a logical one. This is illustrated in FIG. 7B.

As shown in FIG. 7B, as the logical one output from each of the DFFC's with complementary outputs is applied to line $A_i$, a counter, in this case modulo (n=4) is incremented. When the last pulse is received, a carry output will trigger the activation of the memory row $R_i$. The counters may need to be periodically reset.

Both the input n-bit words and the output from the rows of the memory array operate in pipeline fashion. Specifically, with each clock cycle, digital words originally input on the input lines of the address decoder $D_i$ are propagated sequentially through the rows of the address decoder in a continuous fashion. Similarly, the outputs of rows of the memory array which are selected by the output lines $A_i$ of the address decoder are propagated in sequential fashion down the columns of D flip-flops until they reach the output bus which serves as the output of the lookup table.

Note that a digital word input at the input of the address decoder may take several clock cycles before it finds a match in the address decoder which will trigger then the output of the corresponding row of the memory array. When it does, the output from the memory cells of that row are then applied to the D flip-flops and continue down in pipeline fashion to the output bus. As a result, each digital word applied to the input lines $D_i$ as it traverses the address decoder in pipeline fashion will activate one of the output lines which will result in transfer of the contents of a row of the memory array into the corresponding D flip-flops for passing down the memory array pipeline to the output bus. Even though the output for a particular digital word might actually be selected subsequent to selection of a different digital word, the overall ordering of the output words on the output bus will be strictly in sequential order corresponding to the input order of the n-bit digital words applied to the input. With 4-bit input numbers (0 to 15), the total throughput delay in all cases will be 18 clock cycles ($\tau$).

Figure 10A:
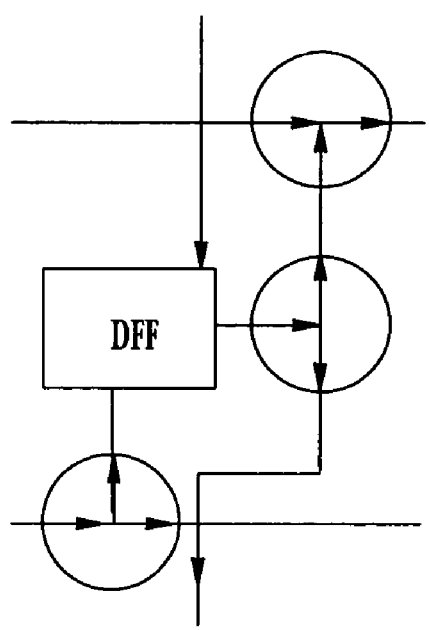
FIGS. 10A and 10B show exemplary layouts of a D flip-flop and an inverter, respectively.
Figure 10B:
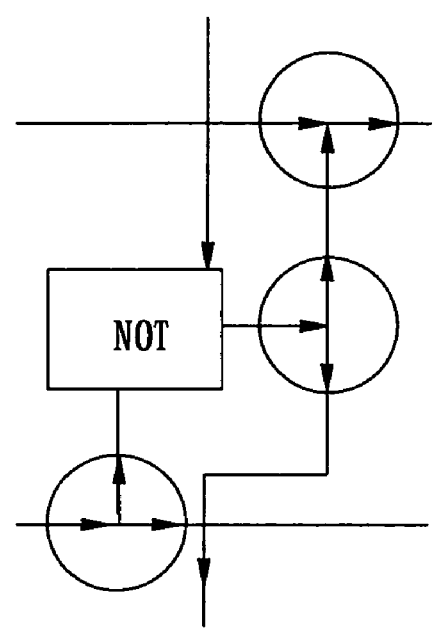

FIGS. 10A and 10B show exemplary layouts of a D flip-flop and inverter, respectively.

Figure 11:
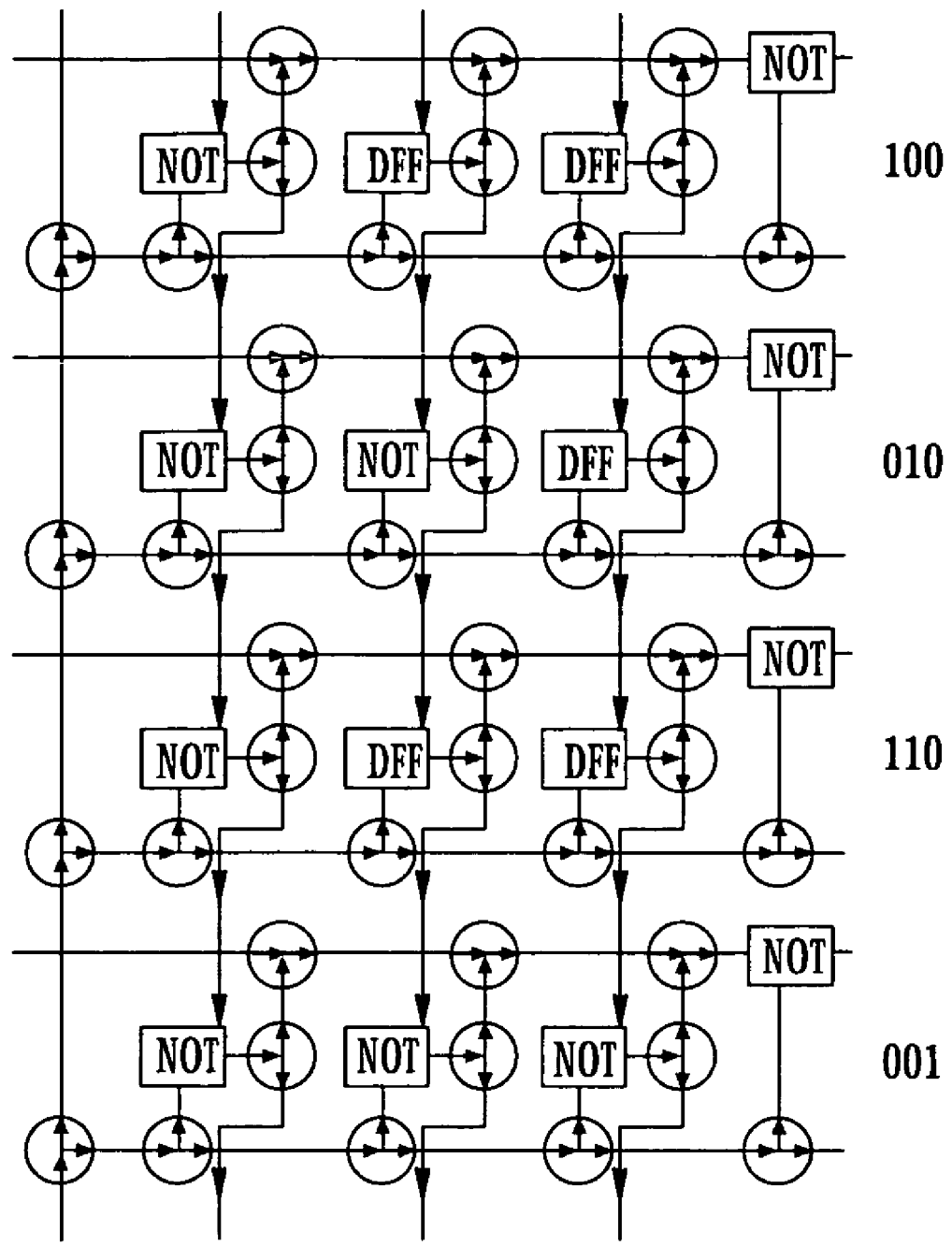
FIG. 11 shows a layout of a portion of an address decoder implemented using D flip-flops and inverters.

FIG. 11 shows a layout of a portion of an address decoder implemented using D flip-flops and inverters.

While various embodiments of the present invention have been illustrated herein in detail, it should be apparent that modifications and adaptations to those embodiments may occur to those skilled in the art without departing from the scope of the present invention as set forth in the following claims.

The claims are:

1. A superconducting look up table, comprising:
   a. an address decoder for receiving digital words of a set of digital words; and
   b. a memory array, receiving an output from said address decoder, having a row of memory cells for each digital word of said set for providing the contents of said row to an output c. in which said address decoder is comprised of a code matching network and signaling logic.

2. The look up table of claim 1 in which the memory array comprises memory cells comprising an RS flip-flop with non-destructive readout.

3. The look up table of claim 2 in which the contents of the memory cells are loaded sequentially from a serial input.

4. The look up table of claim 2 in which the contents of each memory cell are read out to a D flip-flop of a column of D flip-flops.

5. The look up table of claim 1 in which the output is a parallel bus.

6. The look up table of claim 1 in which the memory cells are arranged in rows and columns.

7. The look up table of claim 6 in which the contents of rows of memory cells are read substantially simultaneously and the output of each memory cell in a row is provided to a corresponding D flip-flop of a column of D flip-flops.

8. The look up table of claim 7 in which the output of a row of memory cells is passed in pipeline fashion down respective columns of D flip-flops to an output bus.

9. The look up table of claim 2 in which the contents of all memory cells are loaded from a serial input.

10. The look up table of claim 1 in which the code matching network comprises cells of D flip-flops with complementary outputs.

11. The look up table of claim 1 in which the code matching network comprises cells of D flip-flops or inverters.

12. The look up table of claim 1 in which the address decoder receives words of digital data from a digital bus.

13. The look up table of claim 12 in which the cells of a code matching network are arranged in rows and columns.

14. The look up table of claim 13 in which each row of the code matching network decodes a single digital word and produces an output on a line when a digital word present in the row of cells matches a word for which the row is programmed.

15. The look up table of claim 14 in which digital words are passed in pipeline fashion from row to row for decoding.

16. The look up table of claim 14 in which the output from the code matching network is applied to a row of said memory array that contains desired content corresponding to a word for which the row of the code matching network is programmed.

17. The look up table of claim 1 in which the code matching network and the memory array both operate in pipeline fashion to respectively decode incoming digital words and read out corresponding content desired for the digital words to an output.

18. The look up table of claim 1 implemented as a superconducting integrated circuit.

19. The lookup table of claim 1 in which the signaling logic comprises inverters.

20. The lookup table of claim 1 in which the signaling logic comprises one or more counters.

21. A method for implementing a superconducting look up table, comprising the steps of:
a. providing an RSFQ address decoder for receiving digital words of a set of digital words;
b. providing the output of the address decoder to an RSFQ memory array having a row of memory cells for each digital word of said set for providing the contents of said row to an output; and
c. operating both said RSFQ address decoder and said RSFQ memory array to synchronously pipeline input digital words through the address decoder while pipelining corresponding output words from said memory array to an output.

22. A superconducting look up table, comprising:
a. an address decoder for receiving digital words of a set of digital words;
b. a programmable read-only memory array, receiving an output from said address decoder, having a row of memory cells for each digital word of said set for providing the contents of said row to an output;
c. a readout circuit for the rapid sequential readout of the contents of memory cells corresponding to the sequence of input addresses, while the memory contents remain unchanged; and
d. a memory rewrite circuit for reprogramming the contents of the memory cells with a speed that is substantially slower than the rapid output speed of the memory array.

23. A method for implementing a superconducting look up table, comprising the steps of:
a. providing an address decoder for receiving digital words of a set of digital words;
b. providing a programmable read-only memory array, receiving an output from said address decoder, having a row of memory cells for each digital word of said set for providing the contents of said row to an output;
c. providing a readout circuit for the rapid sequential readout of the contents of memory cells corresponding to the sequence of input addresses, while the memory contents remain unchanged; and
d. providing a memory rewrite circuit for reprogramming the contents of the memory cells with a speed that is substantially slower than the rapid output speed of the memory array.

* * * * *